United States Patent [19]

Davies et al.

[11] 4,306,246

[45] Dec. 15, 1981

[54] METHOD FOR TRIMMING ACTIVE SEMICONDUCTOR DEVICES

[75] Inventors: Robert B. Davies; Robert L. Vyne, both of Tempe, Ariz.

[73] Assignee: Motorola, Inc., Schaumburg, Ill.

[21] Appl. No.: 163,038

[22] Filed: Jun. 26, 1980

Related U.S. Application Data

[63] Continuation of Ser. No. 727,920, Sep. 29, 1976, abandoned.

[51] Int. Cl.³ .................. H01L 29/72; H01L 23/48; H01L 29/44
[52] U.S. Cl. ........................ 357/36; 357/35; 357/65; 357/68; 357/51
[58] Field of Search ............... 357/35, 36, 65, 68, 357/51; 323/94, 97

[56] References Cited

U.S. PATENT DOCUMENTS

| | | | |
|---|---|---|---|
| 3,231,810 | 1/1966 | Carson | 323/94 |
| 3,303,400 | 2/1967 | Allison | 357/51 |
| 3,441,804 | 4/1969 | Klemmer | 357/35 |
| 3,490,040 | 1/1970 | Roberts | 323/97 |
| 3,543,102 | 11/1970 | Dahlberg | 357/36 |
| 3,584,183 | 6/1971 | Chiaretta | 357/51 |
| 3,634,924 | 1/1972 | Neale et al. | 357/71 |
| 3,761,787 | 9/1973 | Davis et al. | 357/35 |
| 3,930,304 | 1/1976 | Keller et al. | 357/51 |
| 4,016,483 | 4/1977 | Rubin | 357/51 |

*Primary Examiner*—Andrew J. James
*Attorney, Agent, or Firm*—John A. Fisher

[57] ABSTRACT

A method for achieving active devices with closely matched characteristics for use in high performance monolithic integrated circuits. The method comprises providing active devices with appropriately segmented junction regions connected in parallel by their metallic links and severing one or more of the links in order to achieve matching of both the static and dynamic characteristics of two or more active devices.

7 Claims, 4 Drawing Figures

４,306,246

METHOD FOR TRIMMING ACTIVE SEMICONDUCTOR DEVICES

This is a continuation of application Ser. No. 727,920, filed Sept. 29, 1976.

SUMMARY

Many circuits employ differential amplifiers to achieve high performance. By fabricating the active devices in proximity in a monolithic integrated circuit, economical fabrication of matched devices is facilitated and high performance circuits are realized. However, the device matching depends both on geometrical and doping concentration factors, so that even with devices made side-by-side in the same integrated circuit chip, matching is seldom perfect and is often inadequate for the most stringent circuit requirements. Because of their high input impedances, field effect transistors are desirable in many applications. However, field effect transistor characteristics are even more sensitive to physical variations than the characteristics of bipolar transistors. Hence, field effect transistors have not heretofore been widely utilized in monolithic differential amplifiers.

Since differential amplifiers include load impedances as well as active devices, limited matching may be achieved by adjusting the load impedances. For example, it is known to trim thin film load resistors in order to null offset voltage. While low offset voltages can be achieved in this manner, this technique often leads to unequal voltage gains in the amplifier sections. Also the trimming of load resistors is often difficult to implement on a mass production basis for thin-film resistors in an integrated circuit because the small size of the resistors requires that laser trimming be utilized; such trimming heats the resistors and changes their value; this transient must decay before remeasuring the resistance value and incrementing the trim if required, so that the process is slow compared with the capabilities of automatic test equipment. Trimming the resistor also removes its passivation so that it may subsequently drift in value.

In the present invention, matched active devices are achieved by segmenting one of the active junctions in the device and connecting all the segments in parallel by means of the conventional metallization used to interconnect the various circuit components. The metallization is arranged so that the metal links to the active segments can be completely severed by a micromachining, as with a laser. Alternatively, diodes could be inserted in series with the segments in a direction to oppose current flow. Selected ones of these diodes could subsequently be internally shortcircuited by passing a short high-energy pulse through the diode in order to cause the metallization to penetrate the shallow diode structure. In this way, active sections could be added as needed to achieve matching. Thus the device current and gain can be altered by opening one or more of the metal links. The junction segments are made of different sizes according to the expected variation in electrical characteristics between the active devices in the required matched pairs.

DETAILED DESCRIPTION OF THE INVENTION

Figure 1:
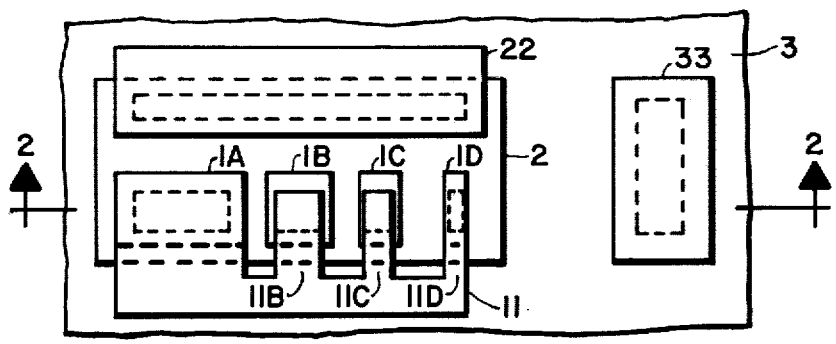
FIG. 1 is a top view of a bipolar transistor embodiment of the present invention.
Figure 2:
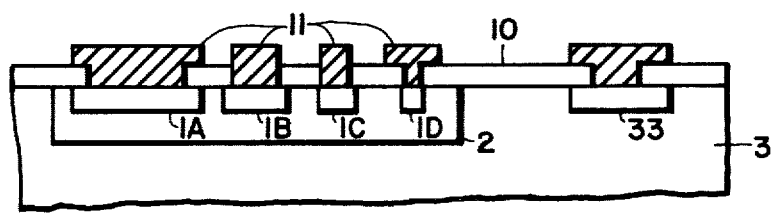
FIG. 2 is a cross-section of FIG. 1.

FIG. 1 shows a top view of a bipolar transistor adapted to embody the present invention. Region 3 of first conductivity type is the collector of the transistor containing base region 2 of opposite conductivity type. Regions 1A, 1B, 1C and 1D of first conductivity type are emitters contained in base 2 and have different areas. Emitters 1A, 1B, 1C, and 1D are electrically connected by a thin film conductor 11 which contacts the emitter regions through apertures through insulator 10 as shown in FIG. 2. Patterned regions 22 and 33 from the same thin film conductor make contact to base region 2 and collector region 3 respectively. While not shown in the drawings, lateral extensions of the conductor lead from regions 11, 22 and 33 to other components in a monolithic integrated circuit.

Emitter region 1A is selected to have an area (when viewed from the top as in FIG. 1) much greater than the areas of regions 1B, 1C and 1D, whose areas are typically unequal. When two devices like that depicted in FIG. 1 are made in close proximity (though the collectors perhaps separated by conventional junction isolation) in a monolithic integrated circuit, the collector currents of two devices with identical terminal voltages applied with typically vary by about one percent. The fraction of the collector current contributed by each of the emitter segments 1 in one of the transistors will be very nearly equal to the area of the segment divided by the total emitter area in that transistor. Thus the collector current in the individual transistor may be reduced by such a fraction by severing one of the metal links 11B, 11C, or 11D connecting that segment to the other segments. For example, emitter segments 1B, 1C, and 1D could comprise respectively one percent, one-half percent, and one-quarter percent of the total emitter area, making it possible to reduce the current in the transistor by one-quarter percent increments in the range one-quarter to one and three-quarters percent by severing the one or more of the links 11B, 11C and 11D. Thus to achieve a match between two transistors such as depicted in FIG. 1, one of them might be made with only a single emitter which has an area about one percent less than the total emitter area of the device with the segmented emitters. The current could be matched to one-quarter percent or better if the mismatch in the per unit area emitter current were not more than 1 percent. Ordinarily, the areas themselves can be quite closely controlled by photolithographic techniques as long as the dimensions of the segments are large compared with the lithographic tolerances. Variations in doping density between the two devices then results in most of the mismatch. Clearly, the segment proportions will be determined by both the expected process variation and the required device match.

The degree of match could be determined either by direct measurements on the active devices or by measurement of the characteristics of the concomitant circuit. In either case, the trim process can be automated by comparing measured values of the parameters to be matched against a look-up table stored in a memory associated with the test year and using the results of the comparison to actuate a trim sequence for severing the link or links associated with the active regions to be eliminated from the device. This a priori sequence eliminates the problems associated with active trimming of resistors, where transients associated with thermal machining such as laser trimming of resistors must be allowed to decay before measuring the resistor value. In addition, trimming thin-film resistor bodies removes passivating layers so that the resistors may undergo long term drift. For complete trimming, resistor loads of the devices to be matched could be provided with thin-film metal shorting bars which could be severed in the same manner as those on the active device or devices in order to achieve matching of both active and passive devices without active trimming.

Figure 3:
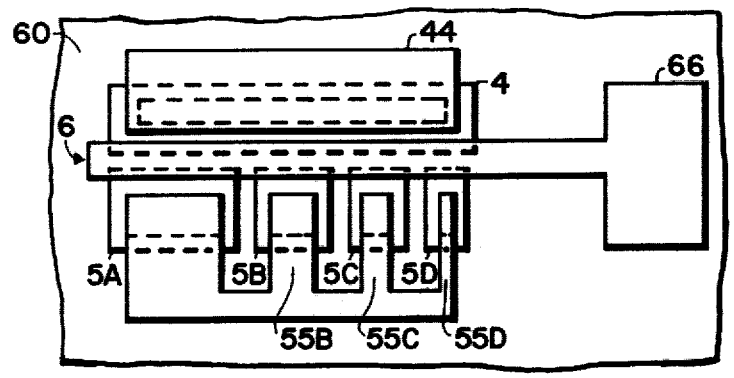
FIG. 3 shows a metal-insulator semiconductor field-effect transistor embodiment of the present invention.

FIG. 3 shows a metal-insulator-semiconductor embodiment of the present invention. Region 60 is a body region of first conductivity type, region 4 is a source of opposite conductivity type, and regions 5A, 5B, 5C and 5D are drains, also of opposite conductivity type. Thin-film metal is over an insulator over body 60 and serves as the gate of the device. Regions 44, 55, and 66 provide contact to the source, drains, and gate respectively, and may be extended to other elements in the integrated circuit. Matching of devices is effected by severing one or more of the conductive links 55B, 55C, or 55D which contact drain regions 5B, 5C or 5D through apertures (shown dashed) in the insulator.

Figure 4:
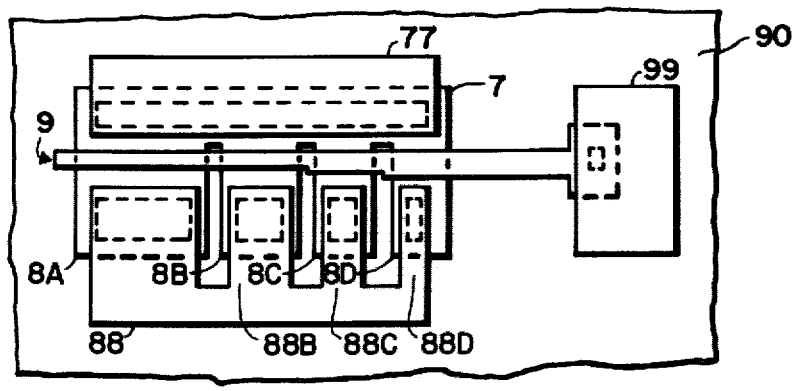
FIG. 4 shows a junction field-effect transistor embodiment of the present invention.

FIG. 4 shows a junction field effect transistor embodiment of the present invention. Region 90 is a body of first conductivity type serving as the lower gate of the device. Region 7 of second opposite conductivity type is a source and regions 8A, 8B, 8C and 8D also of second type are drains of the junction field effect device. Region 9 of first conductivity type is the top gate abutting the source and drain regions and overlying the channel region of second conductivity type. Upper gate region 9 merges with lower gate region 90 at both ends of the structure. Thin-film conductors 77, 88 and 99 make contact to source, drain and gate regions respectively through apertures in an insulating film which overlies said regions. Matching is achieved by severing one or more of the conductive links 88B, 88C or 88D connected to regions 8B, 8C and 8D respectively. These regions are made smaller than 8A in proportion to the expected amount of mismatch; here, as for the insulated gate field effect transistor the device drain current is proportional to the width of the drain region segment abutting gate region 9, rather than the area of the regions as for the bipolar device of FIG. 1.

Because the device shown in FIG. 4 will become untenably large if the drain segment 8A has to be 100 or more times larger than the smallest segment 8D for fine trimming, it is more practical to ratio the segments by changing the length of the channel region rather than (or in addition to) the width. The length of the channel is that dimension of top gate 9 in the direction of current flow between the source 7 and the drain 8. In FIG. 4 for example the channel region is shown wider adjacent to drain segments 8C and 8D than adjacent to 8A and 8B. The current passing through any segment is proportional to the effective width of the channel in that segment divided by its effective length. Other than rectilinear channel configurations might be used. For example the device of FIG. 4 could be reconfigured so that the current flowing from source to drain would pass partially along what is normally the width dimension of the gate in the case where one or more of the links 88 were severed.

Because junction field effect transistors are more sensitive to variations in doping density than bipolar transistors, the ability to trim is essential. Junction-field effect transistors are desirable in many high performance circuits because of their high input impedance, and because their characteristics drift much less over the long term than do those of insulated gate type field effect transistors.

While the invention has been described by three specific device examples, the general technique of matching active devices has potentially much wider applicability. Many more segments could be used to provide increased trim capability, other terminals might be segmented, and other junction devices might be used.

What is claimed is:

1. A method for matching field-effect transistors in a monolithic differential amplifier comprising: segmenting the active regions of at least one of the main terminals of at least one of said transistors to provide channel regions of different effective lengths; connecting said segmented regions to a common main terminal by thermally machinable conductive means; monitoring the relative electrical characteristics of said transistors; and thermally machining said conductive means to adjust the relative electrical characteristics of said transistors.

2. A method for trimming a field effect transistor in a monolithic integrated circuit which comprises the steps of: forming said field effect transistor with a first segmented junction means coupled to a second junction means through channel regions of different effective lengths to provide a multiplicity of parallel current paths; connecting said first segmented junction means to a common main terminal by a plurality of thermally machinable conductive means; monitoring the electrical characteristics of said field effect transistor; and thermally machining selected ones of said plurality of conductive means to adjust the drain current of said field effect transistor.

3. A method for matching first and second field effect devices in a monolithic differential amplifier comprising: forming first of said devices with a first segmented junction means coupled to a second junction means through channel regions of different effective lengths to provide a multiplicity of parallel current paths; connecting said first segmented junction means to a common main terminal by a plurality of thermally machinable conductive means; monitoring the relative electrical characteristics of said first and second devices; and thermally machining selected ones of said plurality of conductive means to adjust the relative characteristics of said first and second devices.

4. The device of claim 3 where said common main terminal is the drain.

5. The method of claim 3 where said different effective lengths are 100:1 or greater.

6. The method of claim 3 where said channel regions of different effective lengths are formed by variable spacing of the first segmented junction means from said second junction means.

7. The method of claim 3 where said monolithic amplifier comprises thin-film resistor loads for said devices and further including forming conductive means for adjusting at least one of said loads without active trimming of said thin-film.

* * * * *